United States Patent [19]

Vierny et al.

[11] Patent Number: 5,378,107
[45] Date of Patent: Jan. 3, 1995

[54] CONTROLLED ENVIRONMENT ENCLOSURE AND MECHANICAL INTERFACE

[75] Inventors: Oskar U. Vierny, Palo Alto; Philip M. Salzman, San Jose, both of Calif.

[73] Assignee: Applied Materials, Inc., Santa Clara, Calif.

[21] Appl. No.: 42,917

[22] Filed: Apr. 1, 1993

[51] Int. Cl.$^6$ .................. B65G 49/00; B65G 65/00
[52] U.S. Cl. ............................. 414/786; 414/217
[58] Field of Search ............ 414/786, 217, 221, 222, 414/153, 291, 292, 160, 172, 331, 414, 403, 422

[56] References Cited

U.S. PATENT DOCUMENTS

| | | | |
|---|---|---|---|
| 4,582,219 | 4/1986 | Mortensen et al. | 220/326 |
| 4,616,683 | 10/1986 | Tullis et al. | 414/217 X |
| 4,687,542 | 8/1987 | Davis et al. | 414/217 X |
| 4,709,834 | 12/1987 | Mortensen et al. | 220/326 |
| 4,842,680 | 6/1989 | Davis et al. | 156/643 |
| 4,943,457 | 7/1990 | Davis et al. | 414/222 X |
| 4,995,430 | 2/1991 | Bonora et al. | 414/217 X |
| 5,026,239 | 6/1991 | Chiba et al. | 414/217 |
| 5,033,927 | 7/1991 | Pelissier | 414/217 |
| 5,044,871 | 9/1991 | Davis et al. | 414/217 X |
| 5,112,277 | 5/1992 | Cruz et al. | 414/217 X |
| 5,139,459 | 8/1992 | Takahashi et al. | 414/217 X |

FOREIGN PATENT DOCUMENTS

| | | | |
|---|---|---|---|
| 2219509 | 9/1987 | Japan | 414/217 |
| 4046781 | 2/1992 | Japan | 414/217 |
| 4159918 | 6/1992 | Japan | 414/217 |
| 9205922 | 4/1992 | WIPO | 414/217 |

Primary Examiner—Michael S. Huppert
Assistant Examiner—James Eller
Attorney, Agent, or Firm—Stephen R. Seccombe

[57] ABSTRACT

Disclosed is a method for enabling the contents of a first chamber to be moved into a second chamber without exposing either chamber to elements making particulate-producing sliding contact. In one aspect of the invention, the method includes providing a carrier for a vertically spaced array of articles such as semiconductor wafers and having a clamping device for clampingly holding each of the articles; locating the carrier within the second chamber; opening the carrier by moving a first portion of the carrier upwardly from a second portion or,he carrier without producing sliding contact within the second chamber; and releasing the a clamping device without producing sliding contact within the second chamber, whereby the articles are accessible within the second chamber.

18 Claims, 10 Drawing Sheets

CONTROLLED ENVIRONMENT ENCLOSURE AND MECHANICAL INTERFACE

BACKGROUND

The present invention relates to systems for transporting materials, parts, or any other objects between controlled environments without introducing contamination from an intervening uncontrolled environment, and more particularly to such systems as applied to processes for manufacturing high density electronic integrated circuits and other products requiring similarly clean and carefully controlled environments.

A problem in integrated circuit manufacturing is the presence of particulates and other forms of contamination on and about the wafers on which the circuits are formed. For example, exposure to ambient air gives rise to wafer surface modification, such as by oxidation, nitrification, absorption of water vapors or other impurities, that require additional steps of wafer surface preparation prior to meaningful processing in the receiving apparatus. One of the major sources of particulate contamination is human-generated, including both particles which are released by human bodies and particles which are stirred up by equipment operators moving around inside a semiconductor processing facility. This aspect of the problem has led to the development of various forms of mechanized and automated processing systems, and enclosed carriers for transporting the wafers between and within such systems. However, the mechanisms themselves are potential generators of particulates. Thus the exclusion of particulates continues to be a limiting factor as device dimensions become smaller and smaller because of the need to avoid the presence of smaller and smaller particles, and because of increased demand for larger integrated circuit patterns.

Wafer processing systems and wafer transport carriers are disclosed in U.S. Pat. Nos. 4,995,430 to Bonara et al. and 5,044,871 to Davis et al. These and other prior art systems for preventing contamination of sensitive articles by particulates and the like at and between process stations remain subject to one or more of the following disadvantages:

1. They are ineffective in that they produce particulates that can contaminate the articles, such as by sliding contact between the articles and loosely fitting holders of the articles or spring compression elements that are used for clamping the articles to the holders. Harmful particulates are also produced by sliding contact of operating door hinges ant other mechanisms that are exposed within the environment of the articles.
2. They are unreliable and expensive to produce in that they require sealed contact between a process station element and a mobile, interchangeable carrier of the articles.
3. They are awkward to use in that mechanisms for transporting the articles must retract sufficiently to clear a swinging carrier door.
4. In systems having vertically oriented carrier doors that sealingly close a carrier opening that extends above the articles, particles proximate the carrier opening are subject to being dislodged as the carrier is opened, the particles falling onto the articles.
4. They have limited application in that they cannot be adapted to existing equipment.

Thus there is a need for a system that permits transport of wafers by a carrier between controlled environments, and that does not exhibit these disadvantages.

SUMMARY

The present invention meets this need by enabling the contents of a first chamber to be moved into a second chamber without exposing either chamber to elements making particulate-producing sliding contact. In one aspect of the invention, a method for so moving the contents of a first chamber into a second chamber comprises the steps of:

(a) providing a carrier for an array of articles, the carrier having first and second carrier portions for defining the first chamber, the articles being supported by the second carrier portion;

(b) enclosing the carrier within the second chamber;

(c) supporting the first carrier portion within the second chamber without producing sliding contact within each of the first and second chambers; and, (d) opening the carrier by moving the second carrier portion away from the first carrier portion and out of contact therewith without producing sliding contact within the second chamber, whereby the articles are accessible within the second chamber.

The carrier can be opened by holding the first carrier portion in an elevated position within the second chamber, and lowering the second carrier portion with the articles to an access position within the second chamber that is spaced below the first carrier portion. Each of the articles can accessible at a transfer level within the second chamber, the second carrier portion being lowered for each of the articles to be accessed by vertically moving the second carrier portion for bringing that article to the transfer level.

The articles are preferably maintained in a clamped condition within the carrier for preventing sliding contact between the articles and the carrier during the locating of the carrier and the supporting of the first carrier portion, the clamped condition of the articles being released for permitting removal of the articles from the second carrier portion without producing sliding contact therebetween. The opening the carrier and the releasing the clamped condition of the articles can be performed simultaneously.

The carrier can have an initial internal pressure, an internal pressure of the second chamber being controlled for matching the initial pressure prior to the step of opening the carrier. Preferably the initial internal pressure of the carrier is not more than approximately 90% of ambient pressure for sealingly holding together the first and second carrier portions, the initial internal pressure more preferably being not more than approximately 50% of ambient pressure. The initial internal pressure of the carrier is further preferably not more than approximately $10^{-5}$ Torr for preventing suspended particle migration within the first chamber and for sealingly holding together the first and second carrier portions.

The articles in the first chamber can be further subsequently moved out of the second chamber without exposing either chamber to elements making particulate-producing sliding contact by closing the carrier by moving the first carrier portion relative to the second carrier portion into contact with the second portion without producing sliding contact within the second chamber; and by removing the carrier from the second chamber. After the carrier is opened and before the carrier is removed, the articles can be clamped within the carrier for preventing sliding contact between the articles and the carrier. The closing of the carrier and the clamping the articles can be performed simultaneously.

In another aspect of the invention, a system for transporting objects from a first environment into a second environment without exposing either environment to sliding contact includes a carrier having the first environment therein and including first and second carrier portions, the second carrier portion being adapted for supporting the objects, the carrier portions being separable for opening the carrier; a receiver having a loading chamber, means for locating the carrier within the loading chamber, and means for defining the second environment within the loading chamber; and opening means for separating the carrier portions without exposing the loading chamber to sliding contact.

The opening means can include a magnetic member supportively located relative to the loading chamber; an armature member fixably located relative to the first carrier portion for supporting the first carrier portion by magnetic attraction to the magnetic member above the first carrier portion; and means for moving the magnetic member sufficiently close to the magnetic member for support of the first carrier portion by the magnetic member. Preferably the magnetic member can be movably supported for smoothly latching and unlatching the first carrier portion, the system further including barrier means for sealingly isolating the magnetic member from the second environment, the barrier means being fixably supported for preventing upward movement of the second carrier portion when the magnetic member moves from the lowered position to the raised position, whereby the second carrier portion is no longer supported by the magnetic member. Thus the present invention provides means for smoothly latching and unlatching the first carrier portion spaced apart from the second carrier portion without exposing the loading chamber to members having sliding contact, thereby excluding particulates from the loading chamber.

The system can further include clamp means on the carrier for clampingly holding each of the objects in spaced relation within the carrier; and means for releasing the clamping means without producing sliding contact within the carrier and without producing sliding contact within the loading chamber, the objects being exposed to the second environment within the loading chamber. The clamp means preferably includes a rigid member, flexure means for movably connecting the rigid member to the second carrier portion, and biasing means on the rigid member for individually biasingly contacting the articles as the rigid member moves toward the articles, and the releasing means comprises a foot member extending downwardly from the rigid member for contacting the first carrier portion as the carrier portions move into sealing contact, the rigid member moving toward the articles when the second carrier portion moves downwardly relative to the foot member, whereby the biasing means contacts the articles without sliding contact with the articles.

In a further aspect of the invention, a system for transporting objects from a first environment into a second environment without exposing the first environment to sliding contact includes the carrier, the clamp means, the receiver, the means for locating the carrier within the loading chamber, the means for defining the second environment within the loading chamber, the means for releasing the clamping means, and opening means for separating the carrier portions. Thus the clamp means, which is potentially of serious concern as a generator of particulates in close proximity to the objects, is effective for automatically restraining the articles without sliding contact when the carrier is closed, the articles being released when the carrier is open.

DRAWINGS

These and other features, aspects, and advantages of the present invention will become better understood with reference to the following description, appended claims, and accompanying drawings, where:

DESCRIPTION

Figure 1:
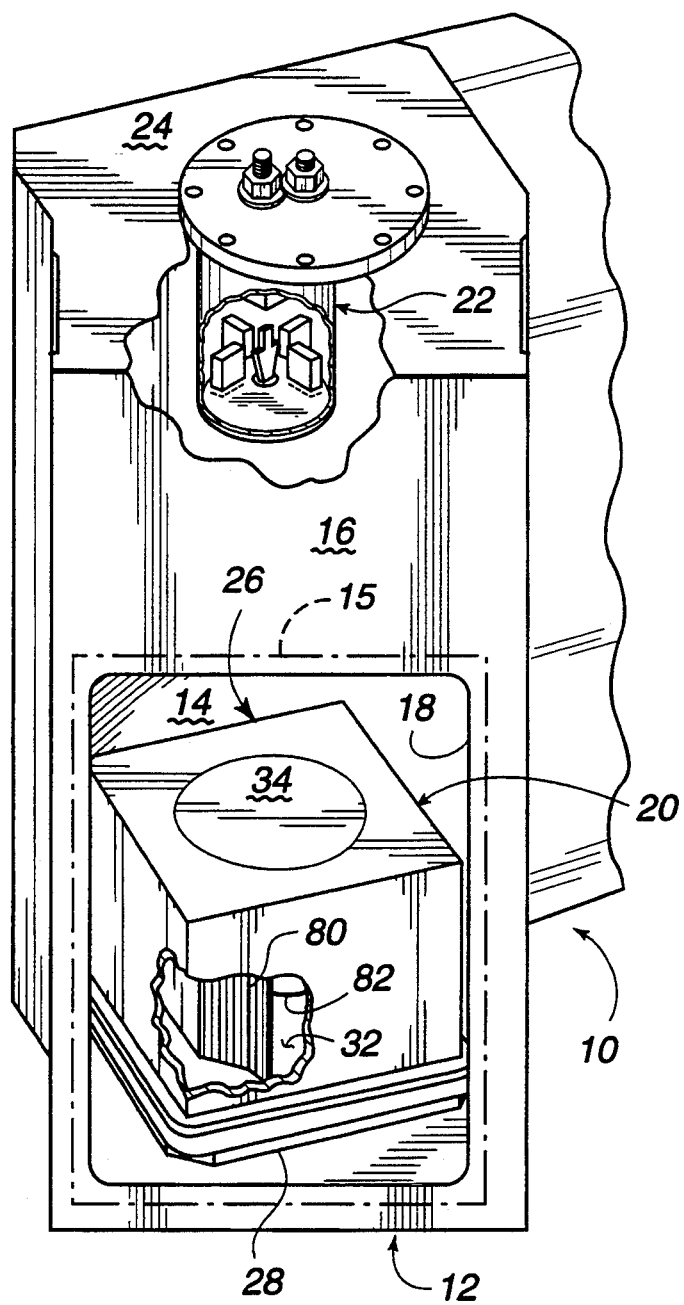
FIG. 1 is a fragmentary, oblique elevational perspective view showing a wafer processing machine according to the present invention, the machine having a load lock and a transportable wafer carrier in a loading position within the load lock.

The present invention is directed to an environmental interface system that permits efficient storage and transfer of articles to be processed, while effectively excluding even very small particulates and other contamination. With reference to FIGS. 1–4 of the drawings, a semiconductor wafer processing machine 10 includes a load lock 12, an environmentally controllable transfer chamber 14 being defined as a bounded volume within the load lock 12 when a loading door 15 of the load lock 12 is closed as indicated by the broken lines in FIG. 1. A controlled environment, such as a suitable vacuum for processing of semiconductor circuit wafers, is maintainable in the transfer chamber 14 by conventional means (not shown).

As shown in the drawings, an exemplary configuration of the load lock 12 includes a housing 16 having a front door opening 18 for receiving a wafer carrier 20 when the loading door 15 is open. A latch assembly 22 that extends within the transfer chamber 14 is supportively mounted to a top wall 24 of the load lock 12 as further described below for controllably supporting a removable cover unit 26 of the carrier 20. The load lock 12 also includes an elevator stage 28 that is vertically controllably movable in a conventional manner such as by a stepper motor (not shown). A preferred elevator mechanism suitable for use as the elevator stage 28 and which does not produce sliding contact having exposure within the transfer chamber 14 is disclosed in co-pending patent application Ser. No. 07/972,659, filed Nov. 6, 1992, which is assigned to the assignee of the present invention. It will be understood that other orientations of the elevator stage 28 are contemplated within the scope of the present invention.

The carrier 20 includes a cassette unit 30 for holding articles to be processed by the machine 10, the cassette unit 30 providing a base of the carrier 20 that is removably locatingly supported on the stage 28. Thus the cover unit 26 and the cassette unit 30 together define a carrier chamber 32 within the carrier 20. As further described below, the cover unit 26 is separable from the cassette unit 30, being maintained in sealing contact with the cassette unit 30 under ambient conditions by there being less than ambient pressure within the carrier chamber 32. According to the present invention, the cover unit 26 is equipped with a latch plate 34 by which the cover unit 26 is supportable by the latch assembly 22, separated from the cassette unit 30.

Figure 2:
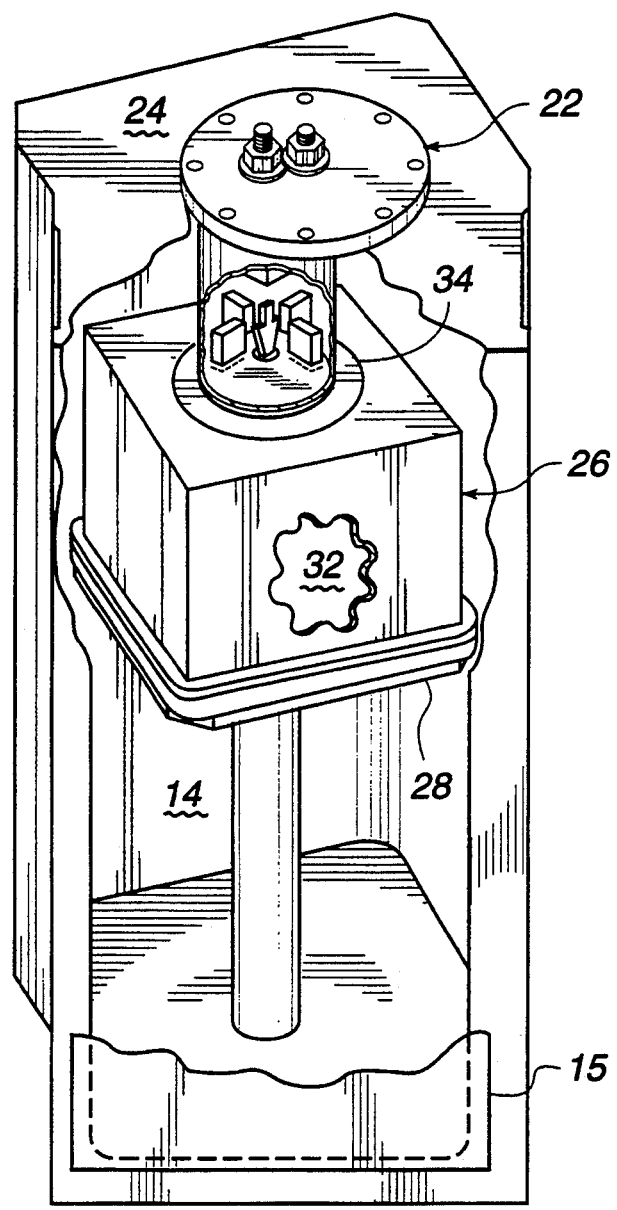
FIG. 2 is a perspective view as in FIG. 1, showing the carrier in a raised position.
Figure 3:
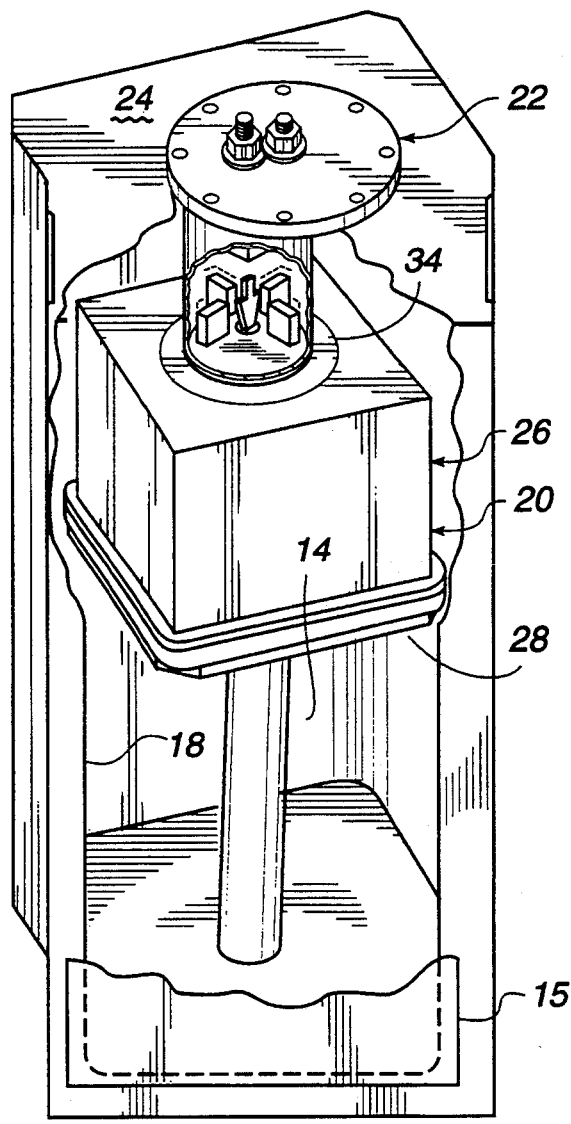
FIG. 3 is a perspective view as in FIG. 2, showing the carrier in the raised position, a cover unit of the carrier being latched in the raised position.
Figure 4:
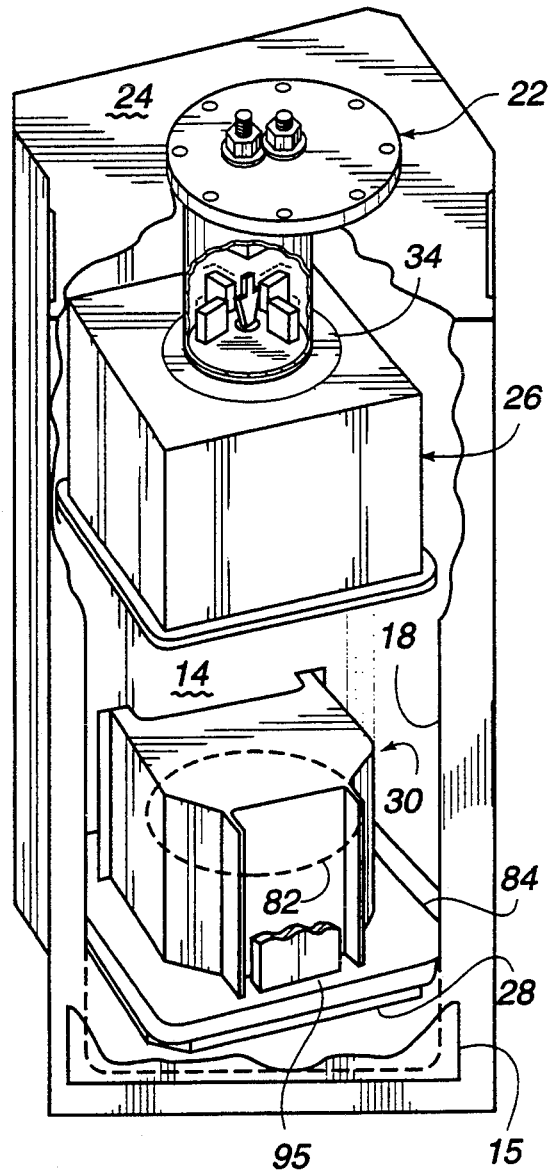
FIG. 4 is a perspective view as in FIG. 1, showing a cassette unit of the carrier in a lowered position, the cover unit being latched in the raised portion.
Figure 6:
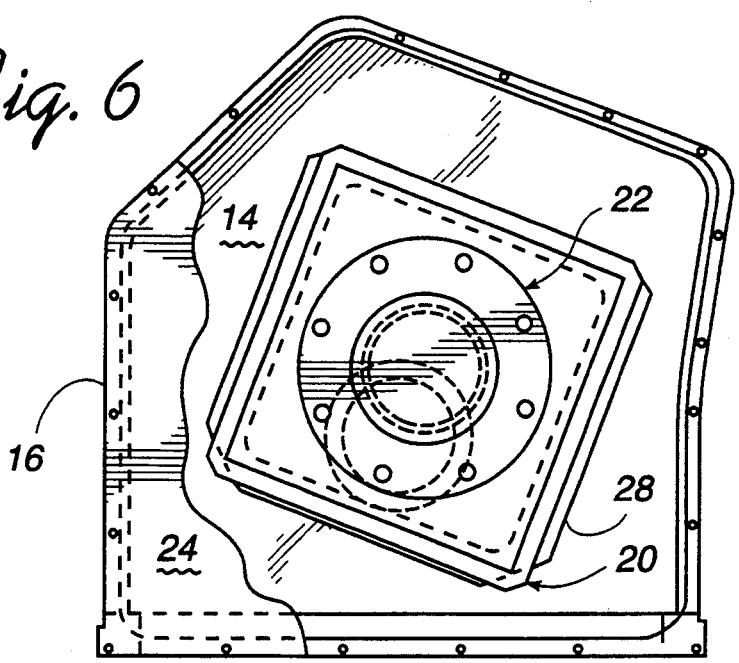
FIG. 6 is a fragmentary top plan view of the load lock of FIG. 5.
Figure 5:
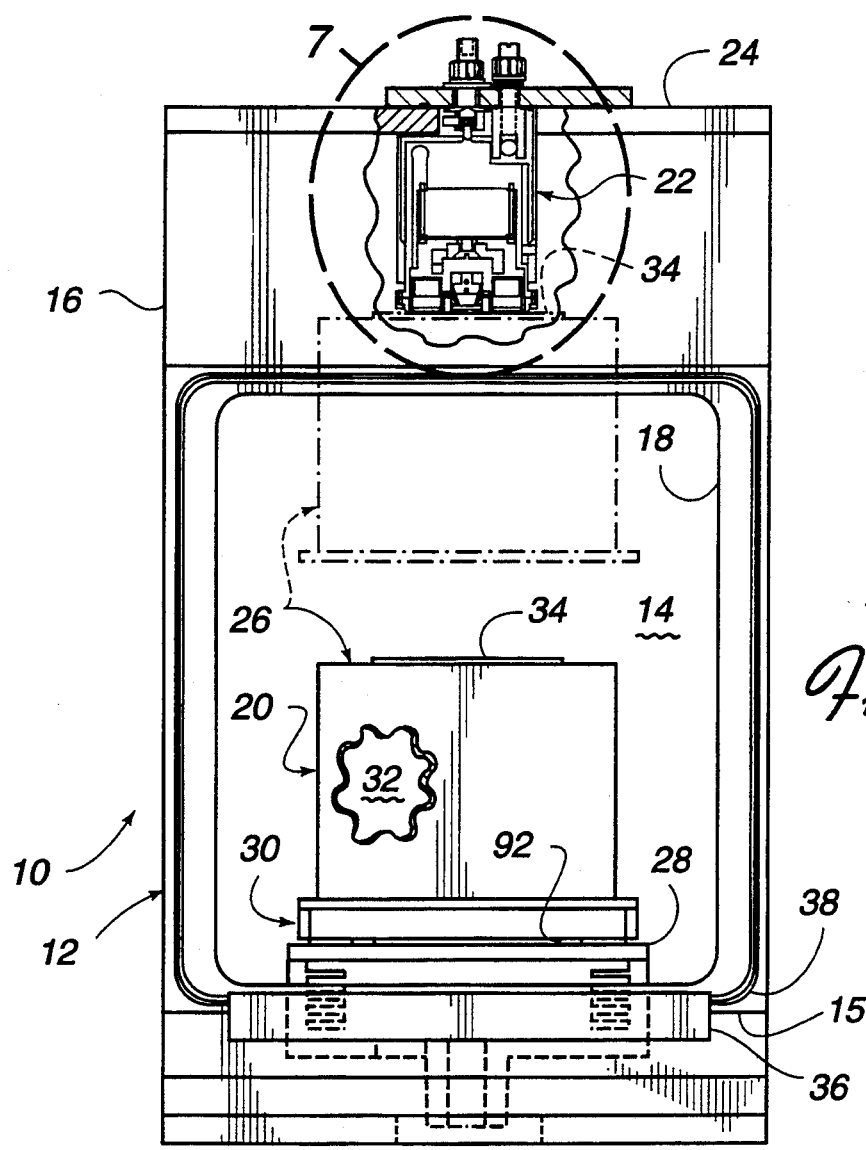
FIG. 5 is a fragmentary, sectional, elevational view showing the load lock and carrier of FIG. 1 in greater detail.
Figure 8:
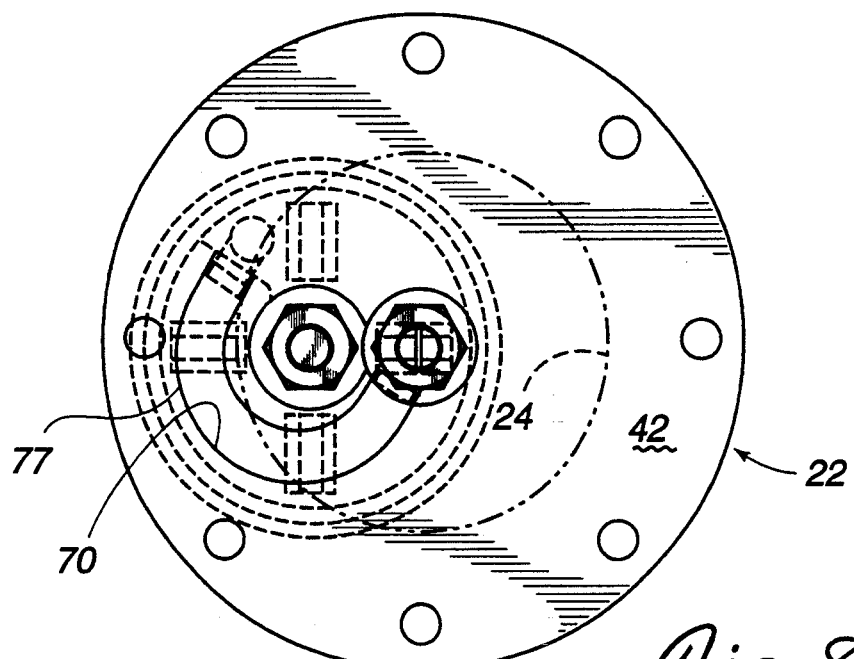
FIG. 8 is a top plan view of the detail of FIG. 7.
Figure 7:
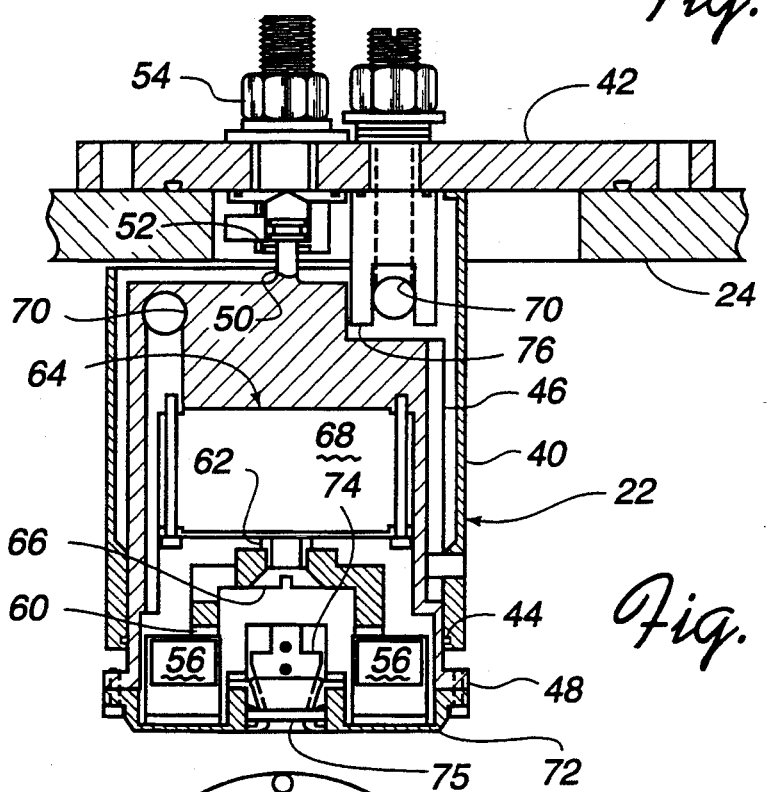
FIG. 7 is a fragmentary sectional elevational detail view of the load lock of FIG. 6 within region 7 thereof.
Figure 9:
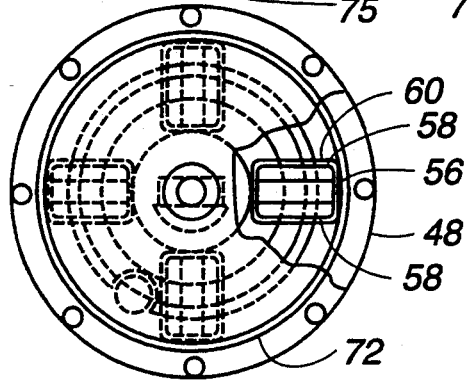
FIG. 9 is a bottom plan view of a portion of the detail of FIG. 7.

FIGS. 1–4 represent a loading sequence according to the present invention wherein the carrier 20 is opened for accessing wafers therein without sliding contact that would otherwise generate harmful particulates. The carrier 20, with the door 15 open, is placed on the stage 28 as shown in FIG. 1, the stage 28 being in a lowered position. As shown in FIG. 2, the stage 28 is raised in a controlled manner until the latch plate 34 of the cover unit 26 lightly contacts the latch assembly 22, internal elements of the latch assembly 22 (described below) being in a raised, inactive position. Also, once the door 15 is sealingly closed following placement of the carrier 20 onto the stage 28, a suitable environment is generated in the transfer chamber 14 for exposure to articles from the carrier 20. Typically, the suitable environment is at less than ambient pressure for matching the pressure within the carrier chamber 32, thereby releasing the cover unit 26 from the cassette unit 30. After the contact by the latch plate 34 with the latch assembly 22, latch assembly 22 is then activated as shown in FIG. 3 (internal elements of the latch assembly being in a lowered position) for holding the cover unit 26 in its elevated position as shown in FIG. 3, and the stage 28 together with the cassette unit 30 thereon is lowered as shown in FIG. 4. It will be understood that the generation of the environment for exposure to the articles can span all or any portion of the time from the closing of the door 15 until the onset of the lowering of the stage 28 from the position shown in FIG. 3.

In an exemplary and preferred configuration of the present invention, the latch assembly 22 acts magnetically, the latch plate 34 of the cover unit 26 being made of a suitable material having high magnetic permeability, such as mild steel. Details of the load lock 12 in the presently preferred configuration of the invention are best shown in FIGS. 5–9 and 14, to which further reference is made. The elevator stage 28 can employ conventional construction, including a drive motor which can be a stepper motor, the motor being designated 35 in FIG. 14. The load lock 12 includes an external ledge member 36 for supportively locating the door 15 against the housing 16, an O-ring or other suitable seal member 38 extending in the housing 16 around the door opening 18 for sealed engagement with the door 15. Further details of the door 15 and attachment thereof to the housing 16 are conventional and form no part of the present invention.

An outer barrel 40 of the latch assembly 22 protrudes through the top wall 24 of the housing 16, being fixedly fastened to a mounting flange 42 that is also sealingly attached on the top wall 24, a lower extremity of the barrel 40 having an internal bearing ring 44 for pivotally locating an inner barrel 46 proximate a lower flange extremity 48 thereof. The inner barrel 46 also has an upper extremity in the form of an upstanding headed stem 50 that is locatingly supported from a bracket 52, the bracket 52 being horizontally adjustably fixed by a stem fastener 54 to the mounting flange 42 for adjustably orienting the inner barrel 46 for squarely facing contact between the latch assembly 22 and the latch plate 34 as further described below.

A plurality of latch magnets 56 and associated pole piece members 58 are supported on a spider member 60 proximate a lower extremity of the inner barrel 46, the spider member 60 being fixedly attached to a piston rod 62 of an actuator 64 by a fastener 66 for vertical movement therewith. A body portion 68 of the actuator 64 is fixably mounted within the inner barrel 46, one or more pneumatic conduits (designated 69 in FIG. 14) for operating the actuator 64 passing from the load lock 12 through an umbilical passage 70, the conduits being connected to a suitable pneumatic control valve 71. A barrel cap 72 is sealingly fastened under the lower flange extremity 48 of the inner barrel 46 for isolating the magnets 56 and other components within the inner barrel 46 from the transfer chamber 14, a bottom surface of the barrel cap 72 being contacted by the latch plate 34. An optical proximity sensor 74 is fixedly mounted on the cap 72 within the inner barrel 46 for sensing by means of a reflected light beam the presence of the latch plate 34 proximate the barrel cap 72, a sensor window 76 also being sealingly mounted to the cap 72. The umbilical passage 70 is formed partly in the inner barrel 46, partly in an umbilical feed-through member 76 that is sealingly clamped to the mounting flange 42, and partly in a flexible umbilical hose 77 that is connected between the inner barrel 46 and the feed-through member 76. Wired connections to the sensor 74 are made to a load lock controller, also through the umbilical passage 70, the controller being designated 78 in FIG. 14. The controller is operative for driving the motor 35 of the elevator stage 28, the pneumatic control valve 71, and a wafer transfer stage 79 in response to the proximity sensor 74 and a supervisory monitor (not shown) of the processing machine 10. Thus the sensor 74 is operative for terminating upward movement of the stage 28 as the latch plate 34 comes into contact with the bottom surface of the barrel cap 72.

With further reference to FIGS. 10–13, the cassette unit 30 of the carrier 20 includes a wafer cassette 80 of standard configuration for holding 25 semiconductor wafers 82 that are articles to be processed by the machine 10. The wafer cassette 80 is mounted to a base plate 84 by clamp means 86, the base plate 84 having a pair of alignment bushings 88 that are engaged by corresponding registration pins 90 of the cover unit 26. The base plate 84 is formed of a material having suitable strength and thickness for withstanding atmospheric pressure differentials of up to one atmosphere between the transfer chamber 14 and the carrier chamber 32. The underside of the base plate 84 is provided with registration means 92 that is preferably dimensionally compatible with existing carrier and/or cassette registration units. A cassette suitable for use as the wafer cassette 80 (for wafers 82 of 6-inch diameter) is available as model PA182-60MB from Fluoroware Corp. of Chaska, Minn. Successful testing has also been conducted using a cassette 88 formed primarily of a nickel-plated aluminum.

Figure 10:
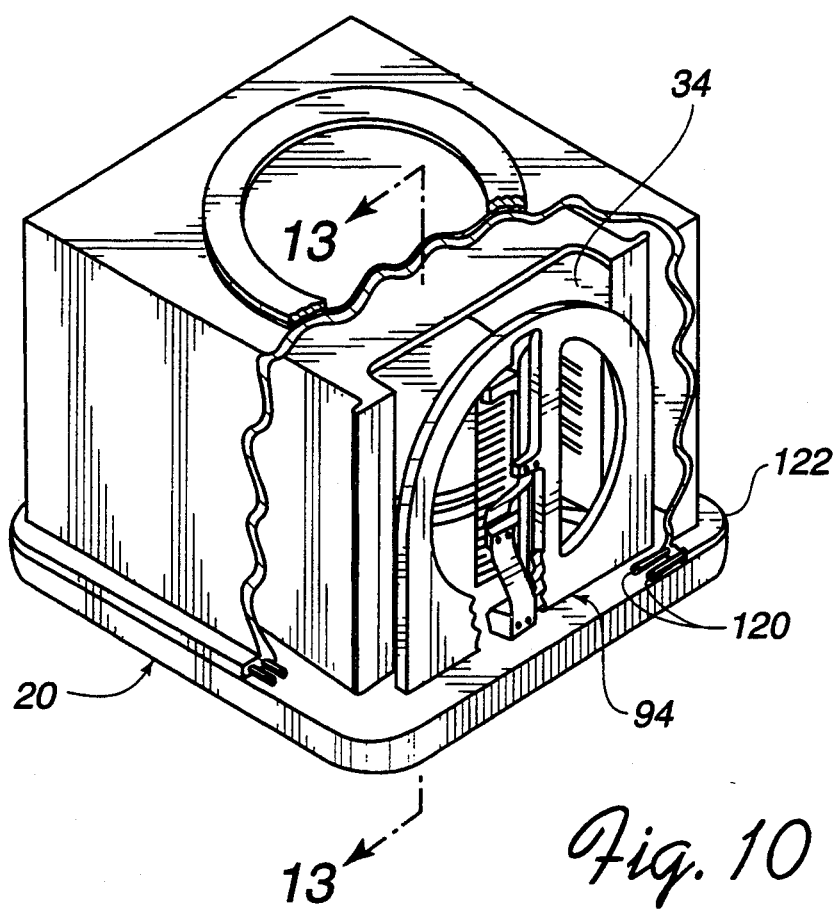
FIG. 10 is fragmentary sectional front oblique elevational perspective view of the carrier of FIG. 1.
Figure 11:
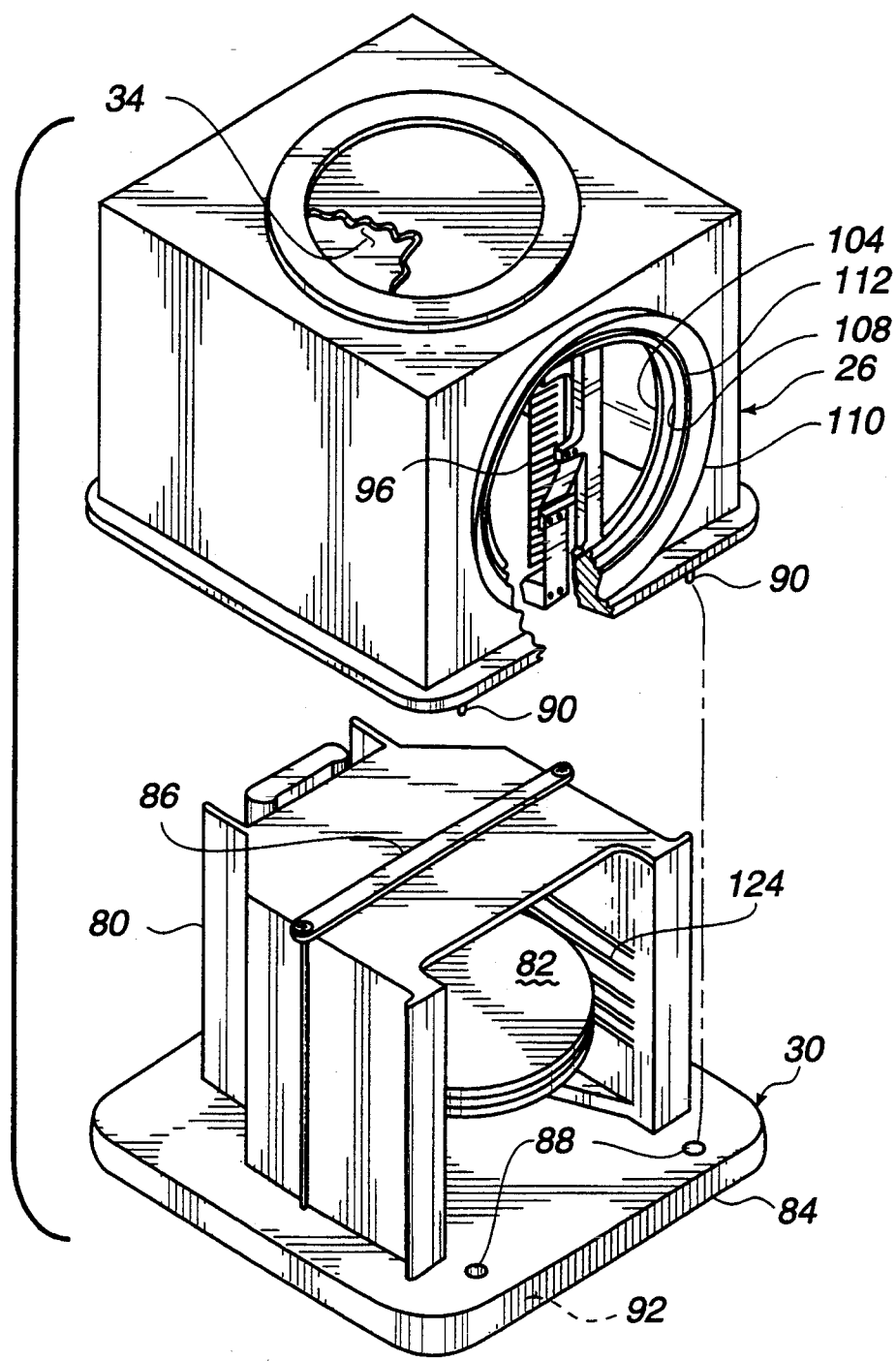
FIG. 11 is a fragmentary front oblique elevational perspective view of the carrier of FIG. 10, the cover unit being elevated above the cassette unit.
Figure 12:
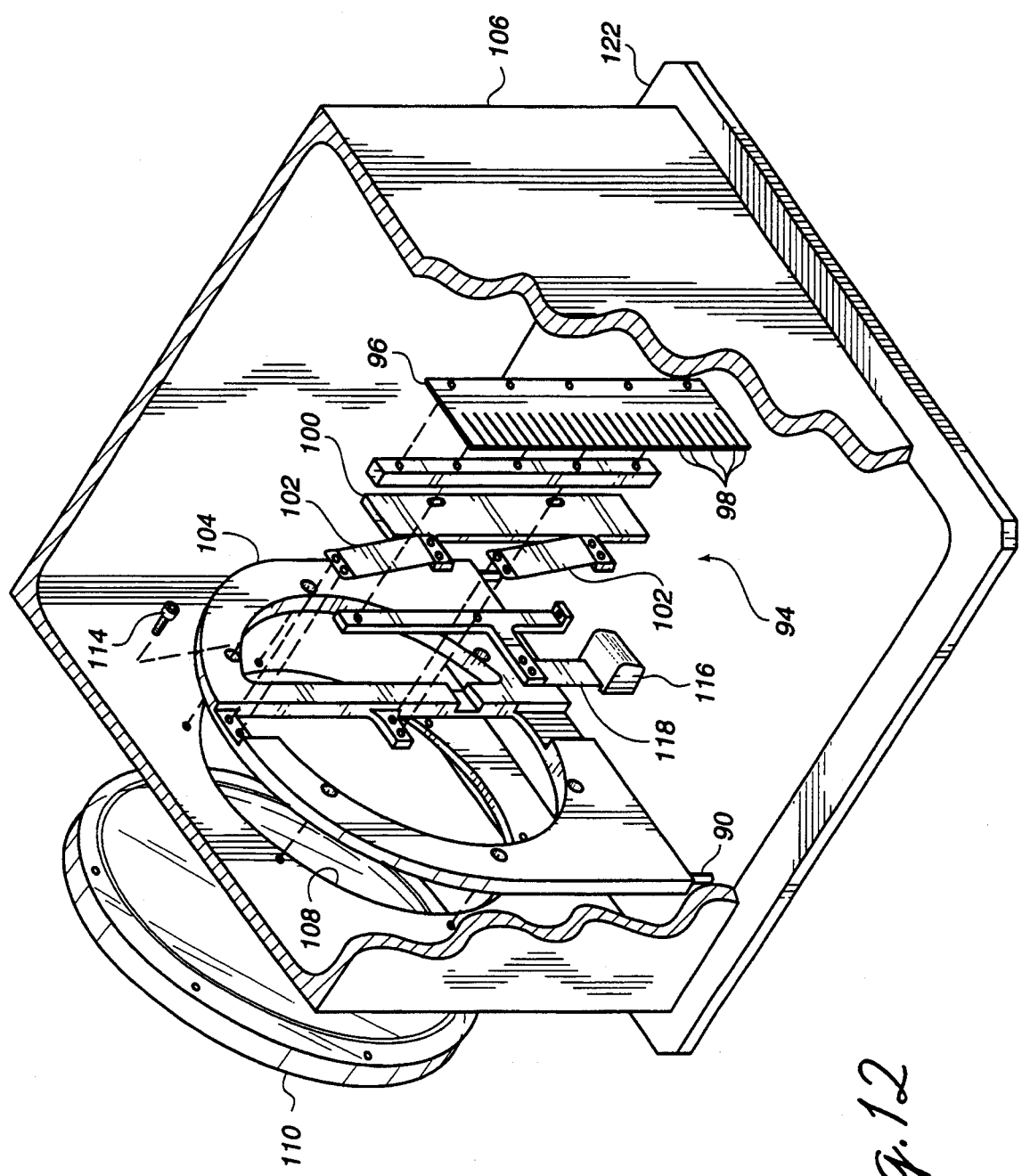
FIG. 12 is a fragmentary sectional rear oblique perspective exploded view of the carrier of FIG. 10.

According to the present invention, the cover unit 26 includes an automatic clamp assembly 94 for holding each of the wafers 82 fixably located against a stop post 95 within the carrier 20 when the carrier 20 is closed as shown in FIGS. 1 and 10, the stop post 95 fixably projecting upwardly from the base plate 84 as shown in FIG. 11. According to a further aspect of the present invention, the clamp assembly 94 automatically releases the wafers 82 for access thereto and transport from the cassette 80 to other locations within the machine 10 without producing harmful sliding contact when the carrier 20 is open as shown in FIGS. 4 and 11. The clamp assembly 94 automatically activates as the carrier 20 is closed in preparation for subsequent removal from the load lock 12 as described below.

The clamp assembly 94 includes a pressure comb member 96 having projecting teeth 98 for individually biasingly contacting outer edges of the wafers 82 upon activation of the assembly 94 as the cover unit 26 is brought into sealing contact with the cassette unit 30. The comb member 96 is fixedly connected relative to a flexure plate 100 having a spaced pair of flexure members 102 connected thereto, the flexure members 102 also being anchored to a mount ring 104 that is fastened to the inside of a cover member 106 of the cover unit 26. Each of the flexure members 102 has an effective length A between opposite attachment points thereof, the length A being approximately 1.25 inch. The flexure members 102 can be suitably made from sheet corrosion-resistant steel having a thickness of from approximately 0.008 inch to approximately 0.010 inch.

The cover member 106 is preferably provided with a window opening 108 and a window member 110 for convenient viewing of the contents of the carrier 20. The window member 110 is provided with an O-ring window seal 112, suitable connecting fasteners 114 extending through the mount ring 104, the cover member 106 and into the window member 110.

The clamp assembly 94 also includes an activator foot 116 that is mounted at a lower extremity of an activator strut 118, an upper extremity of the strut 118 being fixably mounted relative to the flexure plate 100 at a distance B of approximately 1.5 inch from a bottom contact extremity of the foot 116. The foot 116 and the strut 118 act to restrain the comb member 96 at a fixed elevation relative to the wafer cassette 80 when the foot 116 contacts the base plate 84 as the cover unit 26 approaches sealing contact with the cassette unit 30. As further shown in FIG. 10, the cover member 106 has a pair of O-rings 120 attached at a bottom flange extremity 122 for effecting the sealing contact with the base plate 84. The fixed elevation of the comb member 96 relative to the wafer cassette 80 as the cover unit 26 approaches sealing contact with the cassette unit 30 is an important feature of the present invention that permits the teeth 98 of the comb member 96 to be brought into clamping contact with edges of the wafers 82 without producing particulate-generating sliding contact. Further, the teeth 98 are oriented perpendicular to the wafers 82 for producing squarely facing edge contact therewith. In other words, the teeth 98 are not provided with locating grooves that would produce harmful vertical sliding contact with the wafers 82 during engagement therewith. The comb member 96 and the teeth 98 are preferably made from a teflon-filled high-strength plastic such as DELRIN® AF, available from DuPont Company of Wilmington, Del. This material advantageously withstands elevated temperatures of the wafers 82 that are typically present following processing thereof within the machine 10. Also in case of accidental sliding contact against the comb member 96, harmful freely transportable particulates are not likely to be generated because of the gross plastic flow capability that is characteristic of teflon.

Figure 13:
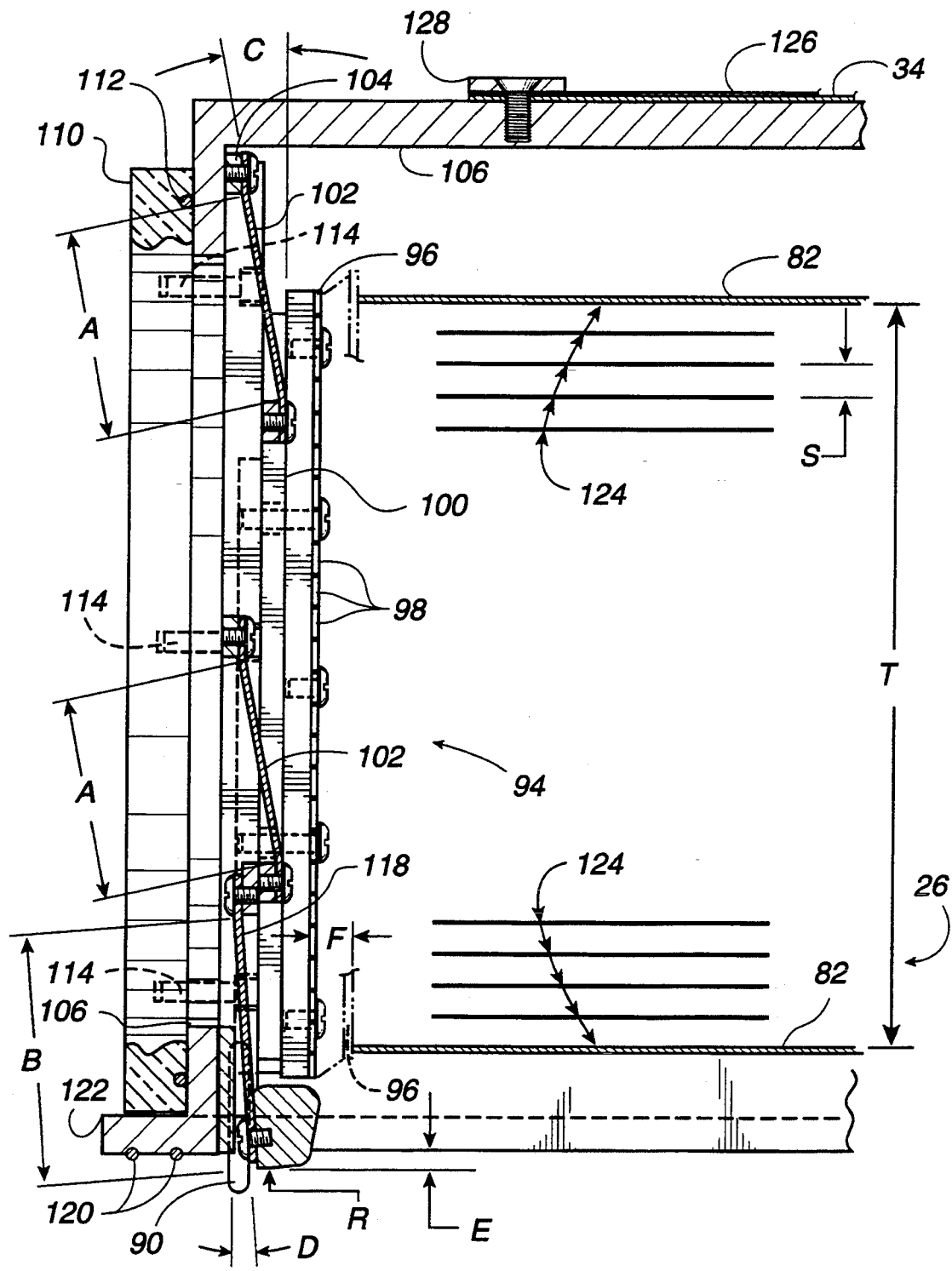
FIG. 13 is a fragmentary, sectional elevational view of the carrier of FIG. 10 on line 13—13 therein.

In FIG. 13, a preferred configuration of the clamp assembly 94 for 6-inch wafers is drawn to scale, the wafers 82 being supported at vertical intervals S of 0.1875 inch within the wafer cassette 80 on conventional ledges 124. It has been found experimentally that this configuration provides that the comb member 96 when contacting the wafers 82 moves vertically, if at all with respect to the wafer cassette 80, upwardly not more than 0.010 inch during activation of the clamp assembly 94. This is because an imaginary line from a point of contact between the foot 116 and the base plate 84 to the attachment of the activator strut 118 (which is slightly flexible) to the flexure plate 100 slopes at an angle D upwardly and slightly away from the wafers 82. The flexure members 102 slope upwardly at an angle C of approximately 11° away from the wafers 82 from the connections to the plate 100 to the connections at the mount ring 104, the angle C being typically greater than the angle D.

In the experimentally tested version depicted in FIG. 13, the angle D is approximately 5° and the foot 116 projects a distance E of approximately 0.115 inch below the cover member 106 when the cover unit 26 is supported apart from the base plate 84 of the cassette unit 30. The effective vertical length of the foot 116 and the strut 118 increases slightly during activation of the clamp assembly 94 by virtue of the angle D being positive as shown in FIG. 13. The foot member 116 is formed slightly convex in side profile, having a bottom radius R of approximately 1.5 inch as further shown in FIG. 13 for smoothly contacting the base plate 84 during slight changes in the angle C that are produced during activation of the clamp assembly 94. The angle D can also change slightly as the foot 116 moves upwardly relative to the cover member 106 while contacting the base plate 84, depending on the curvature of the side profile of the foot 116. Adjustment of the extent to which the comb member 96 moves vertically relative to the wafer cassette 80 is effected by slightly changing the angle D, such as by bending the strut 118.

As further shown in FIG. 13, the latch plate 34 is provided with a protective coating 126 for facilitating the squarely-facing contact with the barrel cap 72 of the latch assembly 22. The latch plate 34, together with the protective coating 126, is secured by a clamp ring 128 to the cover member 106 using suitable fasteners. A preferred material for the protective coating 126 is DELRIN® AF, having a thickness of approximately 0.020 inch thick. The protective coating 126 has a particularly low coefficient of friction for facilitating minute alignment of the latch plate 34 against the barrel cap 72 as contact is made therewith. Also, the teflon component of the DELRIN ® AF, discussed above, permits considerable plastic flow without the generation of harmful particulates. Thus, in the unlikely event that there is relative horizontal movement between the protective coating 126 and the barrel cap 72 as contact is made therebetween, there is no harmful generation of particulates that can migrate onto the wafers 82.

The latch plate 34, being made of mild steel, can have a thickness of approximately 0.06 inch and an outside diameter of approximately 5 inches. Appropriate holding power is obtained for reliably retaining the cover unit 26 against the latch assembly 22 by the use of four of the latch magnets 56, the latch magnets 56 being of conventional sintered ceramic construction, approximately 0.75 inch square, 0.25 inch thick. The pole piece members 58, in the lowered position of the latch magnets 56, rest proximately in contact with the inside of the barrel cap 72, the barrel cap 72 spacing the pole piece members 58 approximately 0.03 inch above the protective coating 126 of the latch member 34.

Once the wafers 82 have been processed to a desired extent within the machine 10, the elevator stage 28 is again raised for returning the base plate 84 of the cassette unit 30 into sealing contact with the cover unit 26 as shown in FIG. 3. Next, the carrier 20 is secured in a closed configuration such as by increasing gas pressure within the transfer chamber 14, the cover unit 26 being sealingly clamped to the cassette unit 30 by differential pressure as described above. For this purpose, a differential pressure of at least approximately 0.1 atmosphere is normally sufficient, although the carrier chamber 32 can also be evacuated to pressures on the order of $10^{-5}$ Torr, if desired, by conducting the above-described sequence with similarly reduced pressure within the transfer chamber 14.

After the carrier 20 is sealingly secured closed as described above, the actuator 64 is activated for raising the magnets 56 a sufficient distance that the latch assembly 22 is no longer effective for supporting the cover unit 26, as shown in FIG. 2, so that the sealed carrier 20 can be smoothly lowered on the elevator stage 28 to the position shown in FIG. 1. Thus the carrier 20 is removable from the transfer chamber 14 following opening of the loading door 15.

Figure 14:
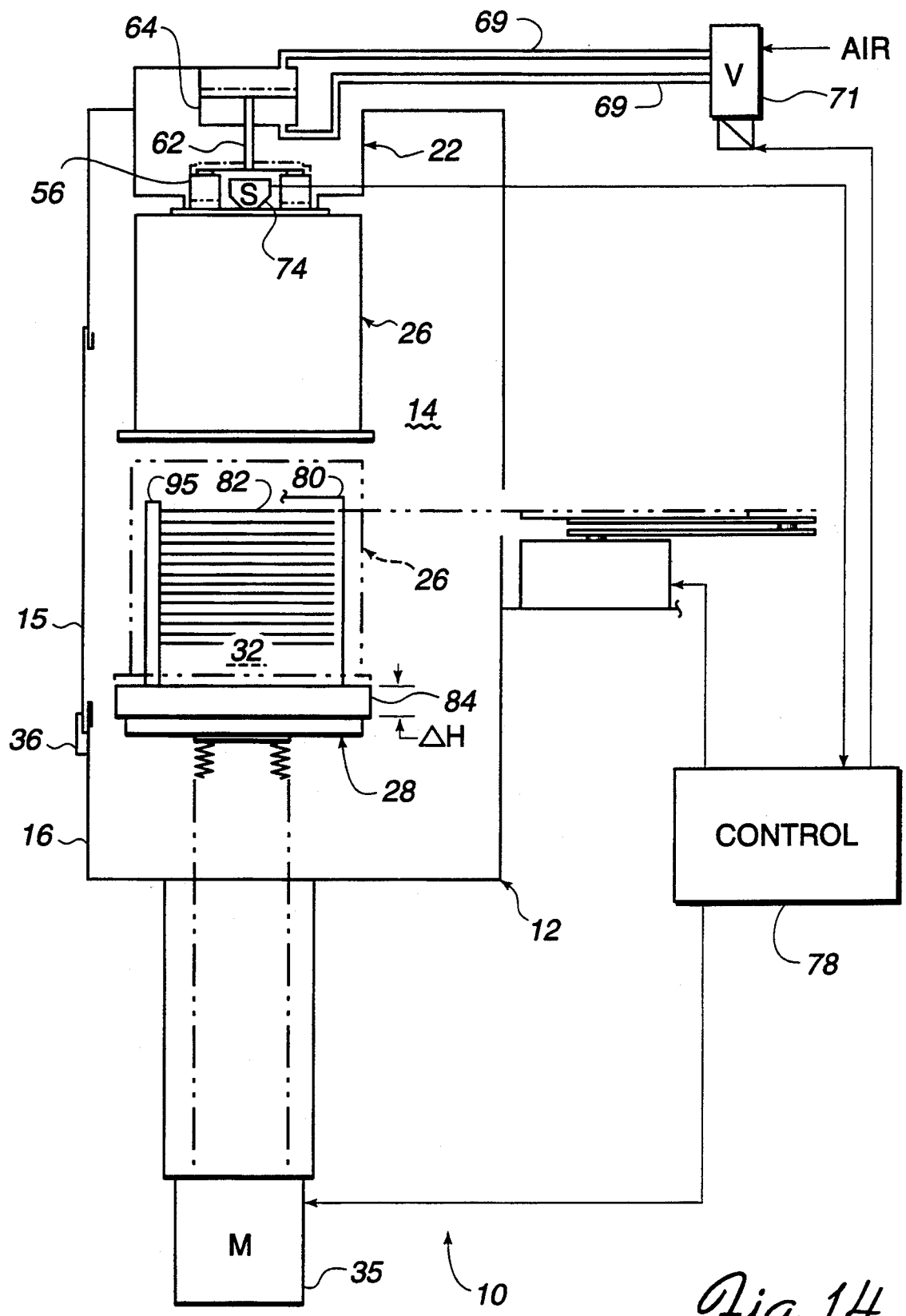
FIG. 14 is a pictorial block diagram of the processing machine of FIG. 1.

As further shown in FIG. 14, the base plate 84 has an effective thickness $\Delta H$ that is preferably an integer multiple of the spacing S of the wafers 82 within the cassette 80 for facilitating use of the present invention in existing equipment. More particularly, while the carrier 80 as used in the present invention is spaced vertically above the elevator stage, 28 by the distance $\Delta H$, movement of the elevator stage 28 for bringing selected ones of the wafers 82 to the transfer level is obtained by simply offsetting a wafer selection integer by the multiple by which $\Delta H$ is greater than S. Further, while typical wafer cassettes 80 provide for 25 of the wafers 82, existing equipment is typically compatible with other numbers of wafers. Moreover, standard cassettes such as the cassette 80 for both 4-inch and 6-inch wafers have the wafer spacing S being 0.1875 inch, and such cassettes for 8-inch wafers have the spacing S being 0.250 inch. Thus a preferred effective thickness $\Delta H$ of the base plate 84 for use in the present invention is 0.750 inch, that thickness being integer multiples of both 0.1875 inch and 0.250 inch.

Although the present invention has been described in considerable detail with reference to certain preferred versions thereof, other versions are possible. For example, the lowering and raising of the latch magnets 56 for activating and deactivating the latch assembly 22, while being preferred for smooth and reliable operation, it is not essential as long as the carrier 20 is sufficiently securely maintained closed and registered to the elevator stage 28 during movement thereof for engaging and disengaging the cover unit 26 relative to the latch assembly 22. Also, different orientations of the elevator stage 28 are possible. The cover unit 26 can be latched to the cassette unit 30 by other than differential pressure, such as by a magnetically-operated latch, in which case the carrier 20 can be sealingly closed with the pressure of the carrier chamber 32 above ambient for insuring that particles do not migrate into the carrier chamber as a result of a faulty seal.

Further, the base plate 84 can be provided with a pneumatic connection for changing the environmental conditions within the carrier chamber independently of the transfer chamber 14, such as for introducing an inert gas such as nitrogen or a process gas, and/or for restoring an evacuated condition of the carrier 20. The cassette 80 can be removably latched to the base plate 84 in lieu of being clamped thereto by the clamp means 86 or, in the alternative, the cassette 80 can be integrally formed with the base plate 84. Moreover, the present invention contemplates operations with all standard sizes of the semiconductor wafers 82 as well as metallic wafers. Therefore, the spirit and scope of the appended claims should not necessarily be limited to the description of the preferred versions contained herein.

What is claimed is:

1. A method for moving articles from a first chamber into a second chamber without exposing either chamber to elements making particulate-producing sliding contact, the method comprising the steps:
   (a) providing a carrier for an array of articles, the carrier having first and second carrier portions for defining the first chamber, the articles being supported by the second carrier portion;
   (b) enclosing the carrier within the second chamber;
   (c) supporting the first carrier portion within the second chamber without producing sliding contact within each of the first and second chambers; and,
   (d) opening the carrier by moving the second carrier portion away from the first carrier portion and out of contact therewith without producing sliding contact within the second chamber,
   whereby the articles are accessible within the second chamber.

2. The method of claim 1, wherein the step of opening the carrier comprises the steps of holding the first carrier portion in an elevated position within the second chamber, and lowering the second carrier portion, together with the articles, to an access position within the second chamber, the access position being spaced below the first carrier portion.

3. The method of claim 2, wherein each of the articles is accessible at a transfer level within the second chamber, and the step of lowering the second carrier portion comprises, for each of the articles to be accessed, vertically moving the second carrier portion for bringing that article to the transfer level.

4. The method of claim 1, further comprising the steps of:
   (a) during the steps of enclosing the carrier and supporting the first carrier portion, maintaining the articles in a clamped condition within the carrier for preventing sliding contact between the articles and the carrier; and
   (b) releasing the clamped condition of the articles for permitting removal of the articles from the second carrier portion without producing sliding contact therebetween.

5. The method of claim 4, wherein the steps of opening the carrier and releasing the clamped condition of the articles are performed simultaneously.

6. The method of claim 1, wherein the carrier has an initial internal pressure of the first chamber, the method comprising the further step of controlling an internal pressure of the second chamber for matching the initial pressure of the first chamber prior to the step of opening the carrier.

7. The method of claim 6, wherein the initial internal pressure of the first chamber is not more than approximately 90% of ambient pressure for sealingly holding together the first and second carrier portions.

8. The method of claim 6, wherein the initial internal pressure of the first chamber is not more than approximately 50% of ambient pressure for sealingly holding together the first and second carrier portions.

9. The method of claim 6, wherein the initial internal pressure of the first chamber is not more than approximately $10^{-5}$ Torr for preventing suspended particle migration within the first chamber and for sealingly holding together the first and second carrier portions.

10. The method of claim 1, further for subsequently moving the articles in the first chamber out of the second chamber without exposing either chamber to elements making particulate-producing sliding contact, comprising the further steps of:
    (a) closing the carrier by moving the second carrier portion relative to the first carrier portion into contact with the first portion without producing sliding contact within the second chamber; and
    (b) removing the carrier from the second chamber.

11. The method of claim 10, comprising the further step of:
    subsequent to the step of opening the carrier and prior to the step of removing the carrier, clamping the articles within the carrier for preventing sliding contact between the articles and the carrier.

12. The method of claim 11, wherein the steps of closing the carrier and clamping the articles are performed simultaneously.

13. A system for transporting objects from a first environment into a second environment without exposing either environment to sliding contact, the system comprising:
    (a) a carrier having the first environment therein and including first and second carrier portions, the second carrier portion being adapted for supporting the objects, the carrier portions being separable for opening the carrier;
    (b) a receiver having a loading chamber, means for enclosing the carrier within the loading chamber, and means for defining the second environment within the loading chamber; and
    (c) opening means in the loading chamber for separating the carrier portions from contact with one anther without exposing the loading chamber to sliding contact.

14. The system of claim 13, wherein the opening means comprises:
    (a) a magnetic member supportively located relative to the loading chamber;
    (b) an armature member fixably located relative to the first carrier portion for supporting the first carrier portion by magnetic attraction to the magnetic member above the first carrier portion; and
    (c) means for moving the armature member sufficiently close to the magnetic member for support of the first carrier portion by the magnetic member.

15. The system of claim 14, wherein the magnetic member is movably supported, the system further comprising barrier means for sealingly isolating the magnetic member from the second environment, the barrier means being fixably supported for preventing upward movement of the first carrier portion when the magnetic member moves from a lowered engaging position to a raised disengaging position, whereby the first carrier portion is no longer supported by the magnetic member.

16. The system of claim 13, further comprising:
    (a) clamp means on the carrier for clampingly holding each of the objects, the objects being spaced in a first direction within the carrier;
    (b) means for releasing the clamp means without producing sliding contact within the carrier and without producing sliding contact within the loading chamber, the objects being exposed to the second environment within the loading chamber.

17. The system of claim 16, wherein the clamp means comprises a rigid member, flexure means for movably connecting the rigid member to the second carrier portion, and biasing means on the rigid member for individually biasingly contacting the objects as the rigid member moves toward the objects, and the releasing means comprises a foot member extending downwardly from the rigid member for contacting the first carrier portion as the carrier portions move into sealing contact, the rigid member moving toward the objects when the second carrier portion moves downwardly relative to the foot member,
    whereby the biasing means contacts the objects without sliding contact with the articles.

18. A system for transporting objects from a first environment into a second environment without exposing the first environment to sliding contact, the system comprising:
    (a) a carrier having the first environment therein and including first and second carrier portions, the second carrier portion being adapted for supporting the objects, the carrier portions being separable for opening the carrier;
    (b) clamp means on the carrier for clampingly holding each of the objects, the objects being spaced in a first direction within the carrier;
    (c) a receiver having a loading chamber, means for locating the carrier within the loading chamber, and means for defining the second environment within the loading chamber;
    (d) means for releasing the clamp means without producing sliding contact within the carrier and without producing sliding contact within the loading chamber, the objects being exposed to the second environment within the loading chamber; and
    (e) opening means in the loading chamber for separating the carrier portions from contact with one another without producing sliding contact within the loading chamber.

* * * * *